US012567662B2

(12) United States Patent
Schrape et al.

(10) Patent No.: US 12,567,662 B2
(45) Date of Patent: Mar. 3, 2026

(54) UWB BANDPASS FILTER

(71) Applicant: HELLA GmbH & Co. KGaA,
Lippstadt (DE)

(72) Inventors: Joerg Schrape, Lippstadt (DE); Belal Abu Suheil, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 131 days.

(21) Appl. No.: 18/542,601

(22) Filed: Dec. 16, 2023

(65) Prior Publication Data

US 2024/0120630 A1 Apr. 11, 2024

Related U.S. Application Data

(63) Continuation of application No. PCT/EP2022/064960, filed on Jun. 1, 2022.

(30) Foreign Application Priority Data

Jun. 21, 2021 (DE) ...................... 10 2021 115 979.2

(51) Int. Cl.
| | |
|---|---|
| *H01P 3/08* | (2006.01) |
| *H01P 1/203* | (2006.01) |
| *H05K 1/02* | (2006.01) |

(52) U.S. Cl.
CPC ........ *H01P 1/2039* (2013.01); *H01P 1/20336* (2013.01); *H01P 3/08* (2013.01);
(Continued)

(58) Field of Classification Search
CPC .... H01P 3/08; H01P 1/20336; H01P 1/20345; H01P 1/203; H01P 1/2039
(Continued)

(56) References Cited

U.S. PATENT DOCUMENTS 5,922,650 A * 7/1999 Ye ........................... H01P 7/082
505/703
10,116,024 B2 10/2018 Shaman et al.
(Continued)

FOREIGN PATENT DOCUMENTS

| CN | 202474163 U | 10/2012 |
|---|---|---|
| CN | 111129673 A | 5/2020 |

(Continued)

OTHER PUBLICATIONS

International Search Report dated Sep. 16, 2022 in corresponding application PCT/EP2022/064960.
(Continued)

*Primary Examiner* — Rakesh B Patel
(74) *Attorney, Agent, or Firm* — Muncy, Geissler, Olds & Lowe, P.C.

(57) ABSTRACT

A UWB band pass filter that is formed by a circuit board. The circuit board includes a first dielectric layer made of a dielectric substrate, a filter structure made of electrically conductive material, on a first side of the first dielectric layer, a first ground layer made of electrically conductive material, on a second side of the first dielectric layer. The filter structure has an input terminal and an output terminal between which a line extends that includes multiple first line sections and second line sections, and wherein the filter structure has multiple stubs that are situated between the first line sections and that branch off from the second line sections. The first line sections and the stubs are situated in parallel. The longitudinal line of the middle first line sections is inserted, from which two open stubs that are rotationally symmetrical about the middle first line sections branch off.

10 Claims, 2 Drawing Sheets

(52) U.S. Cl.
CPC ........... H05K 1/024 (2013.01); H05K 1/0259
(2013.01); *H05K 2201/0183* (2013.01)

(58) Field of Classification Search
USPC ........................................ 333/185, 202–205
See application file for complete search history.

(56) References Cited

U.S. PATENT DOCUMENTS

2002/0163405 A1    11/2002  Miyazaki et al.
2014/0218135 A1     8/2014  Chen et al.

FOREIGN PATENT DOCUMENTS

EP          3451440  A1    3/2019
JP          H09260902  A   10/1997
WO      WO2006070035  A1    7/2006

OTHER PUBLICATIONS

Cem Sansever; "Design of a Microstrip Bandpass Filter for 3.1-10.6
GHz Uwb Systems"; 2013; Electrical Engineering and Computer
Science—Thesis.

* cited by examiner

UWB BANDPASS FILTER

This nonprovisional application is a continuation of International Application No. PCT/EP2022/064960, which was filed on Jun. 1, 2022, and which claims priority to German Patent Application No. 10 2021 115 979.2, which was filed in Germany on Jun. 21, 2021, and which are both herein incorporated by reference.

BACKGROUND OF THE INVENTION

Field of the Invention

The invention relates to a UWB band pass filter that is formed by a circuit board, wherein the circuit board includes a first dielectric layer made of a dielectric substrate, a filter structure made of electrically conductive material, on a first side of the first dielectric layer, a first ground layer made of electrically conductive material, on a second side of the first dielectric layer, wherein the filter structure has an input terminal and an output terminal, between which a line extends that includes multiple first line sections and second line sections, and wherein the filter structure has multiple first stubs that are situated between the first line sections and that branch off from the second line sections.

Description of the Background Art

A notch filter designed in the so-called microstrip technology is known from the document U.S. Pat. No. 10,116,024 B2, which is incorporated herein by reference. A filter structure is provided on one side of a dielectric layer.

A UWB band pass filter having the features mentioned at the outset is described in Chapter 3 of the master's thesis by Cem Cansever, titled "Design of a Microstrip Bandpass Filter for 3.1-10.6 GHz Uwb Systems" (2013); Electrical Engineering and Computer Science—Theses. 1; https://surface.syr.edu/eecs_thesis/1. The line between the input terminal and the output terminal extends along a line between the input terminal and the output terminal. The stubs branch off at a right angle thereto. All stubs are situated on one side of the line between the input terminal and the output terminal. The circuit board, which forms the UWB band pass filter, is long and narrow. As a result, the UWB band pass filter or the circuit board has a long installation length. The described UWB band pass filter is thus unsuitable for some applications.

Therefore, the object underlying the invention is to alter a UWB band pass filter, formed by a circuit board, in such a way that the circuit board or the UWB band pass filter has a shorter installation length and is more compact.

SUMMARY OF THE INVENTION

It is therefore an object of the invention to provide that the first line sections and the stubs are situated in parallel to one another. The first line sections situated between the first stubs are rotated by 90° compared to the design known from the prior art. A shortening of the circuit board, and therefore a shorter installation length, may thus be achieved at the expense of a greater width of the circuit board. The circuit board is thus more compact overall, and better suited for many applications.

It is advantageous when the first stubs branch off from the second line sections in a first direction and a second direction in alternation. Low parasitic coupling is thus achieved.

The second line sections may extend at a right angle to the first line sections.

The design of the line may selected in such a way that all first stubs that branch off in the first direction start on or in the region of a first straight line, and that all first stubs that branch off in the second direction start on or in the region of a second straight line extending in parallel to the first straight line. The first line sections are thus situated on a strip between the first and the second straight line, and the second line sections are situated on the first or the second straight line or in parallel (directly or slightly spaced apart) to the first or the second straight line. The first stubs may extend at a right angle to the first or second straight line.

The circuit board may have a second dielectric layer, and the filter structure may be embedded on a first side of the second dielectric layer and between the first and the second dielectric layer. A second ground layer made of electrically conductive material may then be situated on a second side of the second dielectric layer. The circuit board or the UWB band pass filter may thus be designed using a shielded stripline technology, as a result of which high irradiation resistance and radiation resistance may be achieved.

The ends of the first stubs not connected to the second line sections may be connected to the first or the second ground layer via first feedthroughs that are led through the first or second dielectric layer. As a result, the achieved band filter characteristic, and at the same time a direct current path to ground, is achieved which provides ESD protection for a circuit connected subsequent to the filter.

In addition, the first ground layer and the second ground layer may be connected to one another via second feedthroughs that are led through dielectric layers. The irradiation resistance and radiation resistance may also be improved by use of such via guards.

The circuit board or the dielectric material of the circuit board may be a standard FR4 circuit board material, which has the advantage of lower costs.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
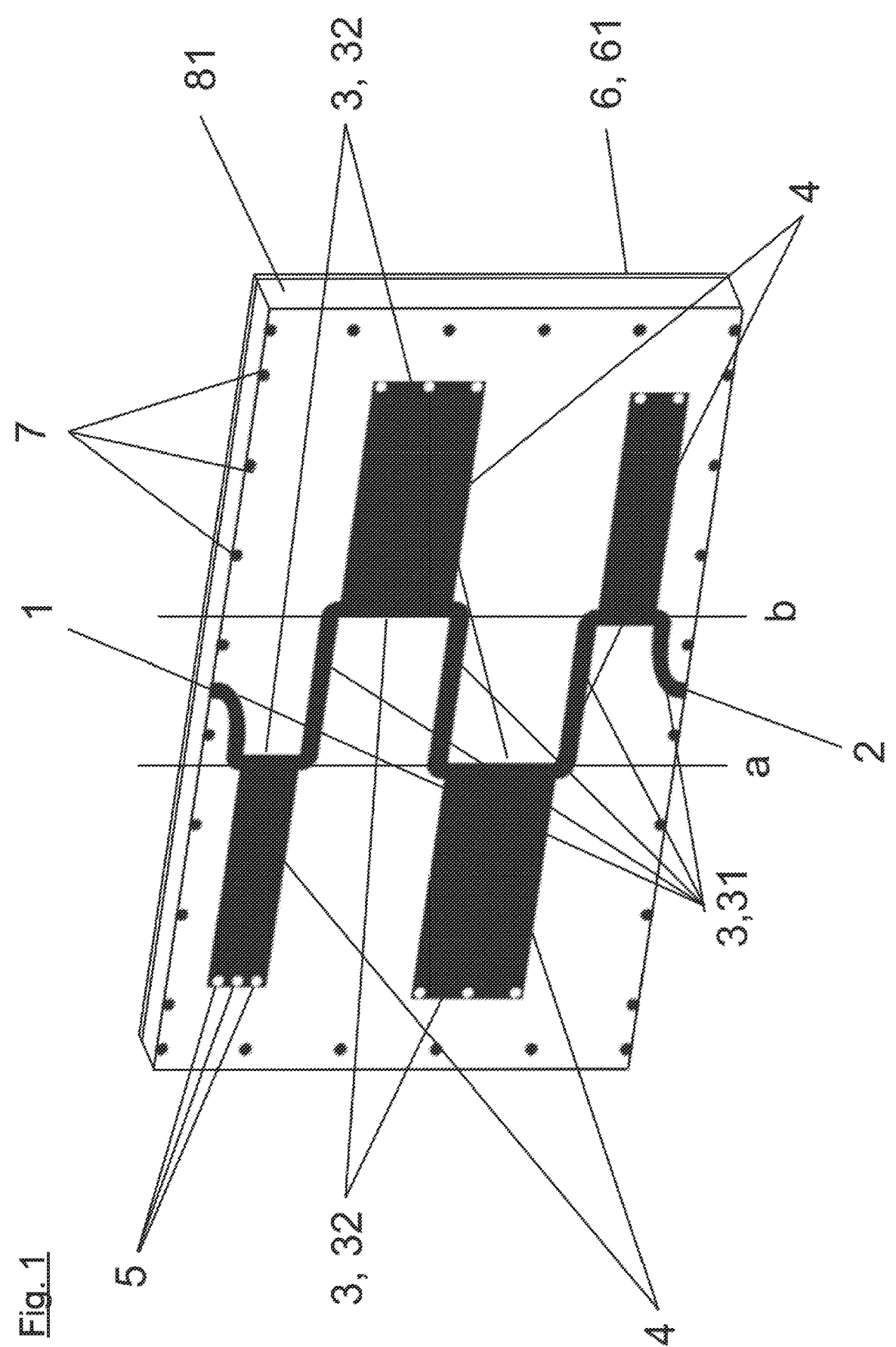
FIG. 1 shows a perspective view of the circuit board that forms the UWB band pass filter; a second ground layer and a second dielectric layer have been removed so that the filter structure is discernible.
Figure 2:
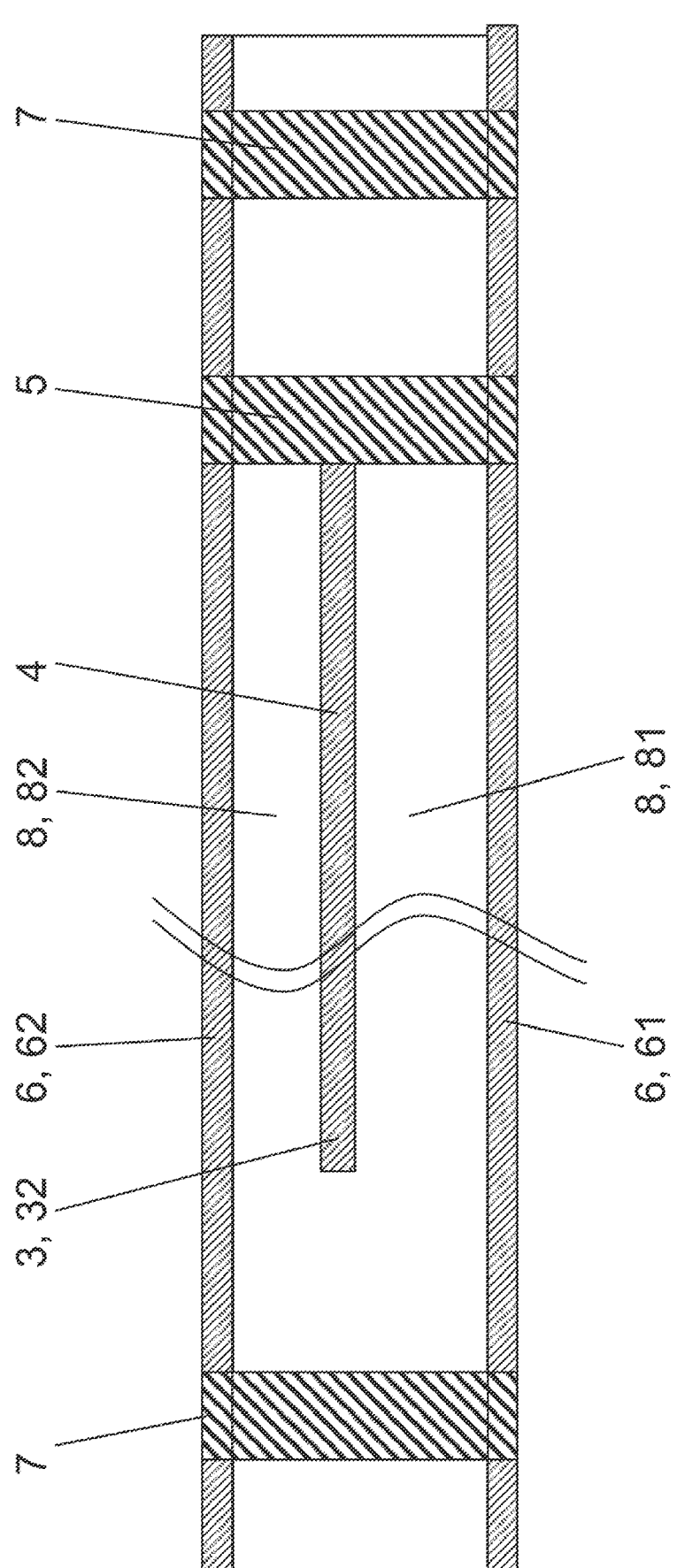
FIG. 2 shows an illustration of a cross section of the circuit board.

The exemplary embodiment of the UWB band pass filter illustrated in the figures is a fourth-order band pass filter having an input terminal 1 and an output terminal 2. An electrically conductive line 3 having first line sections 31 and second line sections 32 extends between the input terminal 1 and the output terminal 2. Electrically conductive first stubs 4 branch off from the second line sections 32. The line 3 and the first stubs 4 form a filter structure 3, 4. This filter structure 3, 4 is embedded between a first electrically conductive ground layer 61 and the second electrically conductive ground layer 62.

Provided between the ground layers 6 and the filter structure 3, 4 are a first dielectric layer 81 and a second dielectric layer 82 in which electromagnetic waves can propagate. The filter structure 3, 4 is also laterally surrounded by dielectric material.

The filter structure 3, 4 is compact, so that the circuit board and the UWB band pass filter formed by the circuit board likewise have a compact design. This is achieved in that the first and the second line sections 31, 32 are not arranged along a line, and instead, successive line sections 31, 32 are angled relative to one another at angles of 90°. The first line sections 31 are thus situated in parallel. The second line sections 32 connect the end of a preceding first line section 31 to the start of a following first line section 31. One of the first line sections 31 is connected to the input terminal 1, and another of the first line sections 31 is connected to the output terminal 2, so that ultimately the line 3 connects the input terminal 1 and the output terminal 2.

The second line sections are situated either on or in the region of a first straight line, or on or in the region of a second straight line, between which the first line sections 31 extend.

The first stubs 4 branch off outwardly at a right angle from the second line sections in a first direction and a second direction in alternation. For this purpose, first ends of the stubs 4 are connected to the second line sections 32.

The circuit board has various feedthroughs 5, 7. First feedthroughs 5 connect second ends of the stubs 4 to the ground layers 61, 62, thus establishing a direct current path to ground which provides ESD protection for a subsequent circuit. The first stubs 4 are thus short-circuited. Second feedthroughs 7 connect the two ground layers 61, 62, thus achieving high irradiation resistance and radiation resistance. These second feedthroughs are provided along the edge of the circuit board The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A UWB band pass filter formed by a circuit board, the circuit board comprising:
  a first dielectric layer made of a dielectric substrate;
  a filter structure made of electrically conductive material, the filter structure being arranged on a first side of the first dielectric layer; and
  a first ground layer made of electrically conductive material, the first ground layer being arranged on a second side of the first dielectric layer,
  wherein the filter structure has an input terminal and an output terminal, between which a line extends that includes multiple first line sections and second line sections,
  wherein the filter structure has multiple first stubs that are arranged between the first line sections and that branch off from the second line sections,
  wherein the first line sections and the first stubs are arranged in parallel to one another, and wherein some of the second line sections extend along a first straight line and other second line sections extend along a second straight line that extends in parallel to the first straight line.

2. The UWB band pass filter according to claim 1, wherein the second line sections extend at a right angle to the first line sections.

3. The UWB band pass filter according to claim 1, wherein the first stubs branch off from the second line sections in a first direction and a second direction in alternation.

4. The UWB band pass filter according to claim 3, wherein all of the first stubs that branch off in the first direction start on or in a region of the first straight line, and all of the first stubs that branch off in the second direction start on or in a region of the second straight line that extends in parallel to the first straight line.

5. The UWB band pass filter according to claim 4, wherein the first stubs extend at a right angle to the first and second straight lines.

6. The UWB band pass filter according to claim 1, wherein the circuit board has a second dielectric layer, and wherein the filter structure is embedded on a first side of the second dielectric layer, so that the filter structure is embedded between the first dielectric layer and the second dielectric layer.

7. A UWB band pass filter formed by a circuit board, the circuit board comprising:
  a first dielectric layer made of a dielectric substrate;
  a filter structure made of electrically conductive material, the filter structure being arranged on a first side of the first dielectric layer; and
  a first ground layer made of electrically conductive material, the first ground layer being arranged on a second side of the first dielectric layer,
  wherein the filter structure has an input terminal and an output terminal, between which a line extends that includes multiple first line sections and second line sections,
  wherein the filter structure has multiple first stubs that are arranged between the first line sections and that branch off from the second line sections,
  wherein the first line sections and the first stubs are arranged in parallel to one another, and
  wherein ends of the first stubs, that are not connected to the second line sections, are connected to the first ground layer via first feedthroughs that are led through the first dielectric layer.

8. A UWB band pass filter formed by a circuit board, the circuit board comprising:
  a first dielectric layer made of a dielectric substrate;
  a filter structure made of electrically conductive material, the filter structure being arranged on a first side of the first dielectric layer; and
  a first ground layer made of electrically conductive material, the first ground layer being arranged on a second side of the first dielectric layer,
  wherein the filter structure has an input terminal and an output terminal, between which a line extends that includes multiple first line sections and second line sections,
  wherein the filter structure has multiple first stubs that are arranged between the first line sections and that branch off from the second line sections,
  wherein the first line sections and the first stubs are arranged in parallel to one another, wherein the circuit board has a second dielectric layer, and
wherein the filter structure is embedded on a first side of the second dielectric layer, so that the filter structure is embedded between the first dielectric layer and the second dielectric layer, and wherein a second ground layer made of electrically conductive material is arranged on a second side of the second dielectric layer.

9. The UWB band pass filter according to claim 8, wherein ends of the first stubs, that are not connected to the second line sections, are connected to the second ground layer via first feedthroughs that are led through the second dielectric layer.

10. The UWB band pass filter according to claim 8, wherein the first ground layer and the second ground layer are connected to one another via second feedthroughs that are led through the first dielectric layer and the second dielectric layer.

* * * * *